United States Patent
Porter

(10) Patent No.: US 10,784,677 B2
(45) Date of Patent: Sep. 22, 2020

(54) ENHANCED UTILITY DISTURBANCE MONITOR

(71) Applicant: S&C Electric Company, Chicago, IL (US)

(72) Inventor: David Glenn Porter, East Troy, WI (US)

(73) Assignee: S&C Electric Company, Chicago, IL (US)

( * ) Notice: Subject to any disclaimer, the term of this patent is extended or adjusted under 35 U.S.C. 154(b) by 232 days.

(21) Appl. No.: 16/176,178

(22) Filed: Oct. 31, 2018

(65) Prior Publication Data

US 2019/0237966 A1 Aug. 1, 2019

Related U.S. Application Data

(60) Provisional application No. 62/622,981, filed on Jan. 29, 2018.

(51) Int. Cl.
*H02H 7/28* (2006.01)
*H02H 1/00* (2006.01)
(Continued)

(52) U.S. Cl.
CPC ............. *H02H 7/28* (2013.01); *G01R 19/02* (2013.01); *G01R 19/2509* (2013.01);
(Continued)

(58) Field of Classification Search
CPC .... H02H 1/0007; H02H 1/0092; H02H 3/253; H02H 7/28; G01R 19/2513; G01R 19/16547; G01R 19/2509; G01R 19/02; G01R 19/0084; G01R 19/003; G01R 19/0038; G01R 19/10
(Continued)

(56) References Cited

U.S. PATENT DOCUMENTS 4,891,571 A * 1/1990 Wong .................... H02M 1/083
 323/241
5,506,743 A * 4/1996 Phillips .................. H02H 7/09
 361/85

(Continued)

OTHER PUBLICATIONS

The International Search Report and the Written Opinion dated Mar. 7, 2019 for the International Application No. PCT/US2018/066358. (11 pages).

*Primary Examiner* — Kevin J Comber

(57) ABSTRACT

A method for detecting a voltage disturbance on an electrical line coupled to a utility that includes calculating a sliding window actual root mean squared (RMS) voltage for each three-phase power signal, calculating a sliding window filtered RMS average voltage for each actual RMS voltage to identify normal changes in the voltage of the power signals from a nominal voltage, and obtaining a difference between the actual RMS voltage and the RMS average voltage for each of the power signals. The method determines whether the difference between the actual RMS voltage and the RMS average voltage for any of the three-phase signals is greater than a first predetermined percentage, or whether the difference between the actual RMS voltage and the RMS average voltage for any of the three-phase signals is less than a second predetermined percentage, and if so, disconnects a load from the utility.

20 Claims, 3 Drawing Sheets

(51) Int. Cl.
*G01R 19/25* (2006.01)
*G01R 19/02* (2006.01)

(52) U.S. Cl.
CPC ....... *G01R 19/2513* (2013.01); *H02H 1/0007* (2013.01); *H02H 1/0092* (2013.01)

(58) Field of Classification Search
USPC .......................................................... 361/86
See application file for complete search history.

(56) References Cited

U.S. PATENT DOCUMENTS

| | | | |
|---|---|---|---|
| 6,445,966 B1* | 9/2002 | Younger | H02P 5/74 318/161 |
| 2014/0062201 A1 | 3/2014 | Giuntiniti et al. | |
| 2015/0094966 A1* | 4/2015 | Abido | G01R 19/02 702/58 |
| 2016/0118795 A1 | 4/2016 | Berkowitz et al. | |
| 2016/0231360 A1* | 8/2016 | Paik | G01R 15/183 |
| 2017/0016940 A1 | 1/2017 | Liu et al. | |

* cited by examiner

ENHANCED UTILITY DISTURBANCE MONITOR

CROSS-REFERENCE TO RELATED APPLICATION

This application claims the benefit of priority from the U.S. Provisional Application No. 62/622,981, filed on Jan. 19, 2018, the disclosure of which is hereby expressly incorporated herein by reference for all purposes.

BACKGROUND

Field

This disclosure relates generally to a system and method for detecting a voltage disturbance on an electrical line coupled to a utility and disconnecting a load from the utility if the disturbance is detected and, more particularly, to a system and method for detecting a voltage disturbance on an electrical line coupled to a utility and disconnecting a critical load from the utility if the disturbance is detected, where the method includes calculating a sliding window root mean squared (RMS) voltage of each phase of a three-phase utility power signal and a sliding window filtered RMS average voltage of each phase of the signal, and determining whether a difference between the sliding window RMS voltage and the filtered RMS voltage is less than or greater than a predetermined value.

Discussion

A power distribution utility provides three-phase electrical power on a power distribution network to deliver the power at the proper voltage for a number of loads, such as homes, businesses, manufacturing facilities, etc. The utility includes various power sources, substations, switching devices, feeder lines, lateral lines, circuit breakers, transformers, current and voltage detectors, etc. that operate to deliver the three-phase power to the loads in a controlled and stable manner.

Faults may periodically occur in the distribution network that create short circuits or near short circuits that may significantly increase the current flow to the fault location from the power source, and may cause electrical voltage disturbances throughout the network, where the voltage sags and decreases at a certain rate and to a certain level depending on the relative location of the fault and the load. Techniques are known in the art that detect the occurrence of such faults typically by detecting a high fault current, and open circuit breakers, reclosers, etc. at the appropriate location to disconnect or remove the fault from the network as quickly as possible so as to prevent damage to circuits and components. However, some of the loads in the distribution network may be critical loads where even a small and/or short disturbance in the voltage of the power signal provided to those loads could have significant consequences. For example, a critical load may be a factory where even a small loss of electrical power can affect machinery in the factory that can cause productivity loss, product damage, etc. Typically, critical loads require a power service that includes all three AC voltage phases that are provided by the utility.

It is known in the art to provide an uninterruptible power supply (UPS) system for these types of critical loads that includes a detector that detects a voltage disturbance on the electrical line from the utility as a result of a fault, a switch for disconnecting the critical load from the utility when a disturbance is detected, and a power supply, such as a bank of batteries, that provides power to the critical load when the switch is opened all in a quick and seamless manner so that the power supply to the load is not interrupted. U.S. Pat. No. 5,943,246, titled, Voltage Detection of Utility Service Disturbance, issued Aug. 24, 1999 to Porter, herein incorporated by reference, discloses one known technique for detecting a voltage disturbance that includes monitoring the instantaneous voltages of all three-phases from the utility, and calculating a sliding window one-half half AC cycle RMS voltage of each phase at a very high sample rate. The RMS voltage calculations are then compared to predetermined maximum and minimum voltage values, for example, +10% or −10% of a nominal voltage, such as 120 volts, and if the RMS voltage calculation of any of the phases exceeds those voltage values, then the system opens the switch to disconnect the critical load from the utility and connects the power supply to the critical load.

It is desirable to set the maximum and minimum voltage values and the calculation sample rate so that the system switches to the power supply very quickly as the voltage sags in response to a voltage disturbance, but not so quickly if the voltage disturbance is not significant enough, and thus is not a result of a fault. In other words, it is desirable to eliminate false positives where if there is a small glitch on the utility power that is not the result of a voltage disturbance caused by a fault, the utility is not disconnected from the critical load.

Although the RMS voltage monitoring technique referred to above has been affective in quickly identifying a voltage disturbance and switching to the UPS power supply without loss of power to the critical load and without a significant occurrence of false positives, improvements can still be made. For example, sometimes a critical load will be receiving normal power at a higher voltage than the nominal voltage, such as at 105% of the nominal voltage, where a 10% voltage sag as a result of a voltage disturbance would not be enough to open the switch and connect the power supply because the system is configured for a 10% sag from the nominal voltage. Thus, in this example, the voltage would need to drop 15% from its operating voltage to reach 90% of the nominal voltage to open the switch and connect the power supply, which could undesirably cause problems in the critical load.

SUMMARY

The present disclosure describes a system and method for detecting a voltage disturbance on an electrical line coupled to a utility that provides three-phase electrical AC power signals to a critical load. The method includes reading instantaneous voltage measurements at a high sample rate of each of the three-phase power signals, and calculating a sliding window actual root mean squared (RMS) voltage for each three-phase power signal over a first predetermined sample period. The method also includes calculating a sliding window filtered RMS average voltage for each actual RMS voltage over a second predetermined sample period to identify normal changes in the voltage of the three-phase power signals from a nominal voltage, and obtaining a difference between the actual RMS voltage and the RMS average voltage for each of the three-phase power signals. The method then determines whether any of the actual RMS voltages is greater than a first predetermined percentage of the nominal voltage, whether any of the actual RMS voltages is less than a second predetermined percentage of the nominal voltage, whether the difference between the actual RMS voltage and the RMS average voltage for any of the three-phase signals is greater than a third predetermined percentage, and whether the difference between the actual RMS voltage and the RMS average voltage for any of the three-phase signals is less than a fourth predetermined percentage. If any of these conditions is met, then a voltage disturbance is detected and a switch is opened to disconnect the critical load from the utility and a back-up power supply is connected to the critical load.

Additional features of the present disclosure will become apparent from the following description and appended claims, taken in conjunction with the accompanying drawings.

DETAILED DESCRIPTION OF THE EMBODIMENTS

The following discussion of the embodiments of the disclosure directed to a system and method for detecting voltage disturbances on a utility service power signal is merely exemplary in nature, and is in no way intended to limit the disclosure or its applications or uses.

Figure 1:
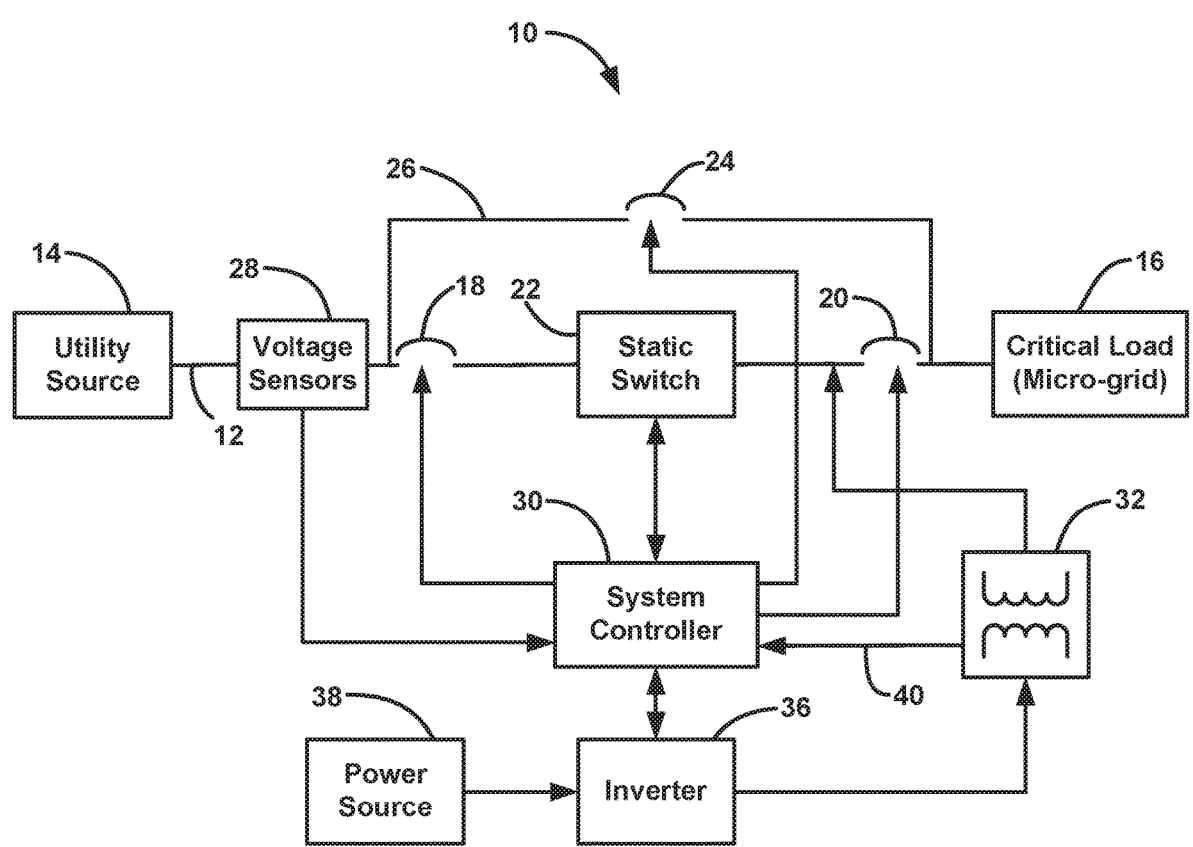
FIG. 1 is a block diagram of an uninterruptible power supply (UPS) system that detects a utility voltage disturbance and transfers power from the utility to a back-up power supply.

FIG. 1 is a schematic block diagram of an uninterruptible power source (UPS) system 10 that is coupled to a power line 12 that delivers power from a utility 14 to a critical load 16. In this example, the critical load 16 is the type of load, such as a manufacturing facility or a factory, that would require power from all of the three-phase power signals that the utility 14 provides, which would be provided on three separate electrical lines, where the line 12 is intended to represent the combination of those lines. The UPS system 10 includes an input circuit breaker 18 provided in the line 12, an output circuit breaker 20 provided in the line 12 and a fast response static switch 22 provided in the line 12 therebetween. A by-pass circuit breaker 24 is provided in a by-pass line 26 so that the circuit breakers 18 and 20 and the static switch 22 can be by-passed under certain operating conditions to directly provide power from the utility 14 to the load 16. The static switch 22 operates to disconnect the utility 14 from the load 16 very quickly in response to detecting a voltage disturbance on the line 12 as a result of a fault in the utility 14, and can have any suitable switching devices therein to perform that task including both electrical and mechanical devices, where electrical switching devices typically operate more quickly than mechanical switching devices. In one non-limiting example, the static switch 22 includes a set of silicon controlled rectifiers (SCRs) to provide the fast switching, such as at 1000th of a second. During normal operating conditions where no voltage disturbance has been detected, the circuit breakers 18 and 20 are closed, the by-pass circuit breaker 24 is open, and the static switch 22 is closed or is conducting.

The UPS system 10 includes a system controller 30 that controls the position of the circuit breakers 18, 20 and 24, and the static switch 22 to connect and disconnect the utility 14 to and from the load 16 in the manner described herein. The UPS system 10 also includes voltage sensors 28 that measure the instantaneous voltages of each of the three-phase signals on the line 12 and provides those voltage measurement signals to the system controller 30. The voltages are analyzed by the controller 30 in the manner described herein to identify a voltage disturbance on the line 12 and will cause the static switch 22 to open in response to the disturbance, and thus disconnect the load 16 from the utility 14. At the same time that the switch 22 is opened, the system controller 30 switches on a power inverter 36 that receives a DC power signal from a secondary power source 38. The secondary power source 38 would typically be a bank of batteries, but may be other types of power sources, such as fuel cells, flywheels, capacitors, etc. The inverter 36 converts the DC power signal from the power source 38 to an AC power signal that is stepped up in voltage by an isolation transformer 32 and provided on the line 12 to the load 16.

As will be discussed in detail below, the present disclosure describes two fast and reliable techniques for disconnecting the critical load 16 from the utility 14 in response to detecting a voltage disturbance on the line 12. It is noted that although the discussion herein refers to the UPS system 10 that disconnects the critical load 16 from the utility 14 by opening the switch 22 and providing power to the load 16 from the power source 38, the described techniques may also be applicable to disconnecting a micro-grid from the utility 14 that may include a switch of the same type as the switch 22. As is known in the art, a micro-grid could be a section of the utility 14 that includes one or more power sources, such as photovoltaic cells, diesel generators, battery modules, wind farms, etc., that provide power to a number of loads, where generally a micro-grid would cover a larger physical area than the critical load 16 and possibly could include one or more critical loads within it.

A micro-grid can be disconnected from the utility 14 in the event of a fault occurring in the utility 14, where the various power sources in the micro-grid can then support the loads in the micro-grid. During normal operation, the micro-grid sources may be reducing the amount of power that the loads in the micro-grid are drawing from the utility 14, or may be placing power onto the utility 14. In the micro-grid embodiment, the inverter 36 may always be providing power onto the line 12 from the power source 38 in addition to the power that is provided by the utility 14, where if the static switch 22 is opened, the power source 38 is the only power source for the micro-grid.

Figure 2:
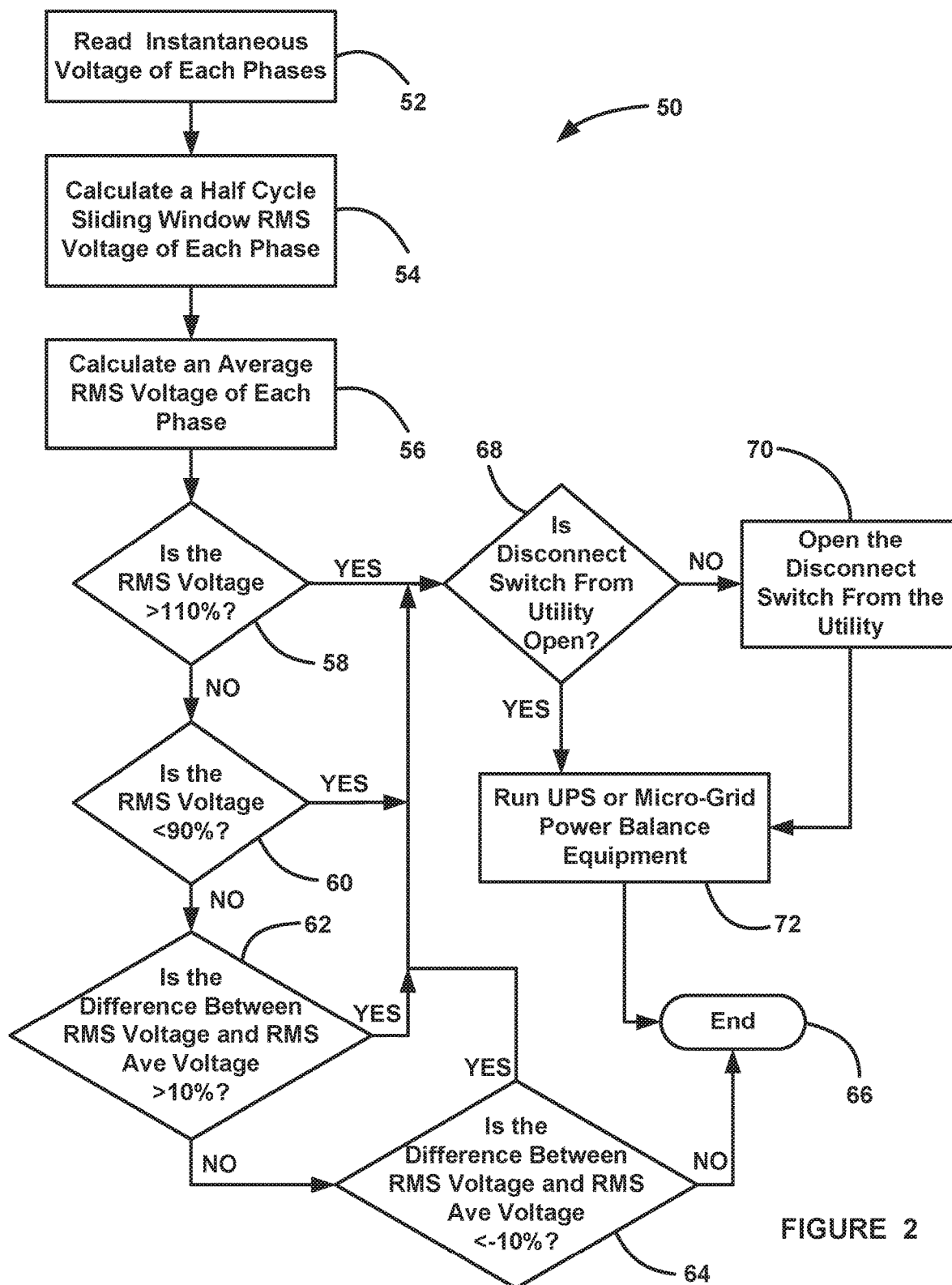
FIG. 2 is a flow chart diagram showing a process for detecting a utility voltage disturbance by calculating RMS voltages of the utility power signal.

FIG. 2 is a flow chart diagram 50 showing one embodiment of a process for determining whether the controller 30 will open the switch 22 in response to a voltage disturbance and connect the inverter 36 to the line 12, as discussed above. Each of the calculations and operations referred to in the diagram 50 is performed at a certain high sampling rate to provide the desired switching speed. In one embodiment, the various calculations are performed at 4800 Hz or 4800 times per second. For a 60 Hz AC signal, there would thus be 80 sample points or calculations per AC cycle, where a one cycle sliding window calculation would include the last 80 sample voltages.

The algorithm reads the instantaneous voltage at the sample rate referred to above for each of the three-phases at box 52, where the three-phases are referred to herein as a, b and c, and the instantaneous voltages are referred to as $V_{a\_inst}$, $V_{b\_inst}$ and $V_{c\_inst}$. The algorithm then calculates a one-half AC cycle sliding window RMS voltage of each phase at box 54 at each sample point to provide RMS voltage values $V_{a\_RMS}$, $V_{b\_RMS}$ and $V_{c\_RMS}$. Since the sliding window is over a one-half cycle, each calculation at each sample point uses the last forty voltage measurements, where the algorithm squares each voltage measurement, adds the forty squared voltage measurements, divides the added voltage measurements by forty and takes the square root of that value to give the RMS voltage values.

At box 56, the algorithm calculates a filtered RMS average voltage for each phase at each sample point to obtain average voltage values $V_{a\_ave}$, $V_{b\_ave}$ and $V_{c\_ave}$ of each phase over a certain time period. In this embodiment, the average voltage values are determined over a sliding window full AC cycle, or eighty sample points. For the filtering calculation, if the voltage of any of the phases increases or decreases, the algorithm does not immediately use that instantaneous increase or decrease in the voltage, but more slowly processes the change in the voltage, where some predetermined percentage of the increase or decrease in the voltage is used in the filtered RMS average voltage calculation. In other words, the algorithm monitors voltage changes on the three-phases so that if the normal operating voltage provided to the critical load 16 from the utility increases or decreases relative to the nominal voltage, that change is slowly determined to be the normal utility voltage so that temporary fluctuating changes in the voltage are not used as the normal voltage. As the voltage of the phases changes, the calculation of the RMS average voltage for each phase will eventually reach the new normal voltage after some predetermined time constant, such as five minutes. Therefore, if there is a voltage disturbance on the line 12, the new normal voltage, if it exists, is also compared to the RMS voltages to determine whether to open the switch 22.

The algorithm will open the static switch 22 or keep the static switch 22 open if any one of four conditions is met. The first condition is provided at decision diamond 58, which determines whether any of the RMS voltages $V_{a\_RMS}$, $V_{b\_RMS}$ and $V_{c\_RMS}$ is greater than a predetermined percentage of the nominal voltage, such as 120 V. In this non-limiting embodiment, that percentage is 10% above the nominal voltage so the algorithm looks for RMS voltage values that are 110% of the nominal voltage. If this condition is not met at the decision diamond 58, then the algorithm determines at decision diamond 60 whether any of the RMS voltages $V_{a\_RMS}$, $V_{b\_RMS}$ and $V_{c\_RMS}$ is less than a predetermined percentage of the nominal voltage, i.e., 90% of the nominal voltage in this example. If this condition is not met at the decision diamond 60, then the algorithm determines whether the difference between the RMS voltages and the filtered RMS average voltages of any of the phases, namely, $V_{a\_RMS}-V_{a\_ave}$, $V_{b\_RMS}-V_{b\_ave}$ and $V_{c\_RMS}-V_{c\_ave}$, is greater a predetermined percentage, such as 10% of the average voltage, at decision diamond 62. Thus, the calculation at the decision diamond 62 determines whether the voltage on any of the phases has increased by 10% or more above the actual voltage, i.e., the new normal voltage, provided by the utility 14, which may be different than the nominal voltage. If the average RMS voltage is the nominal voltage, then a 10% voltage increase would have been determined at the decision diamond 58 before the algorithm reached the decision diamond 62. If this condition is not met at the decision diamond 62, then the algorithm determines whether for each phase the difference between the RMS voltage and the filtered RMS voltage, namely, $V_{a\_RMS}-V_{a\_ave}$, $V_{b\_RMS}-V_{b\_ave}$ and $V_{c\_RMS}-V_{c\_ave}$, is less than −10% of the average voltage at decision diamond 64. If the filtered RMS average voltage is the same as the nominal voltage, and the voltage sag is more than 10%, then the algorithm would have detected this voltage disturbance at the decision diamond 60. If this condition is not met at the decision diamond 64, the algorithm ends at block 66.

If any of the conditions at the decision diamonds 58, 60, 62 and 64 has been met, then a disturbance is detected and the algorithm either opens the static switch 22 or keeps the static switch 22 open to disconnect the critical load 16 from the utility 14. Specifically, the algorithm determines at decision diamond 68 whether the switch 22 is open, meaning it had previously been opened because of one of the conditions of the decision diamonds 58, 60, 62 and 64 had been met, and if not, the algorithm opens the switch 22 at box 70. If the switch 22 is open at the decision diamond 68 or is opened at the box 70, the algorithm then runs UPS system or micro-grid power balance equipment at box 72, and the algorithm ends at the block 66. More specifically, when the critical load 16 or the micro-grid is disconnected from the utility 14, the amount of power being provided to the critical load 16 or micro-grid by the power source 38 may need to be rebalanced so that the power required to operate the load 16 is controlled, where if the power source 38 is generating excess power, it can be used to charge batteries or perform other operations, and if the power source 38 is not providing enough power for the loads, it is controlled to increase its power output or additional power supplies are provided to the load 16.

Based on this discussion, and the example values given, if the one-half cycle RMS voltage of any phase goes below 90% of the nominal voltage, a voltage disturbance is detected and the switch 22 is opened. Further, if the voltage was actually 105% of the nominal voltage, and the one-half cycle RMS voltage dropped 10% of that value to 95% of the nominal voltage, then a voltage disturbance would also be detected, which allows for a faster detection of the disturbance instead of waiting to detect the 90% voltage drop in the known processes. For example, if the system is running at 105% of the nominal voltage and the voltage falls to 70% at the peak of the voltage waveform, the system will go to 95% of the RMS voltage in 1.7 ms and to 90% of the RMS voltage in 4.8 ms. Therefore, by employing the additional calculation of determining the filtered RMS average voltage as discussed, the switch 22 is opened more quickly than in the known systems. Also, if the voltage was actually 95% of the nominal voltage, a voltage disturbance would be detected at 90% of the nominal voltage. Further, recovery is inherent in the algorithm since it looks for a change in the RMS voltage compared to the average voltage. Thus, if the voltage is 105% of the nominal voltage and drops to 94% of the nominal voltage, a voltage disturbance will be detected. If the voltage stays at 94% of the nominal voltage, the disturbance will be cleared later when the average voltage goes below 104%. In other words, in this example, the drop in voltage to 94% the nominal voltage is not an actual voltage disturbance, but is a reduction in the normal operating voltage.

In an alternate embodiment for determining whether there is a voltage disturbance on the line 12 from a fault in the utility 14, the magnetic flux in the transformer 32 is analyzed. The voltage across the transformer 32 is the same as the voltage provided by the utility 14, where the magnetic flux in the transformer 32 can be calculated as the integral of the volts across the transformer 32 at a rate, for example, of 4800 times per second, which is a straight forward calculation, where normally the voltage goes positive and negative overtime and averages to zero. During a fault, the voltage on the line 12 remains at or near zero for some time because of the fault. During this time, the transformer flux does not change because the voltage is low or close to zero. Since transformer flux is the integral of volt seconds on the transformer core, the flux accumulates as the integral of the voltage rather than the integral of the voltage squared. Therefore, by adding the voltage measurements of the utility 14 on the line 12 at consecutive sample points, the flux in the transformer 32 can be calculated and used to detect a voltage disturbance in some cases more quickly than by calculating the RMS voltage at the sample points as discussed above. For example, if the measurements and calculations are performed 80 times per AC cycle and the voltage goes to zero at the zero voltage crossing, one-half cycle RMS voltage takes 2.7 ms to drop from 100% at the nominal voltage to 90%. If the flux change algorithm looks for a change of 10% in the peak transformer flux, a 10% voltage drop can be detected in 1.25 ms.

Figure 3:
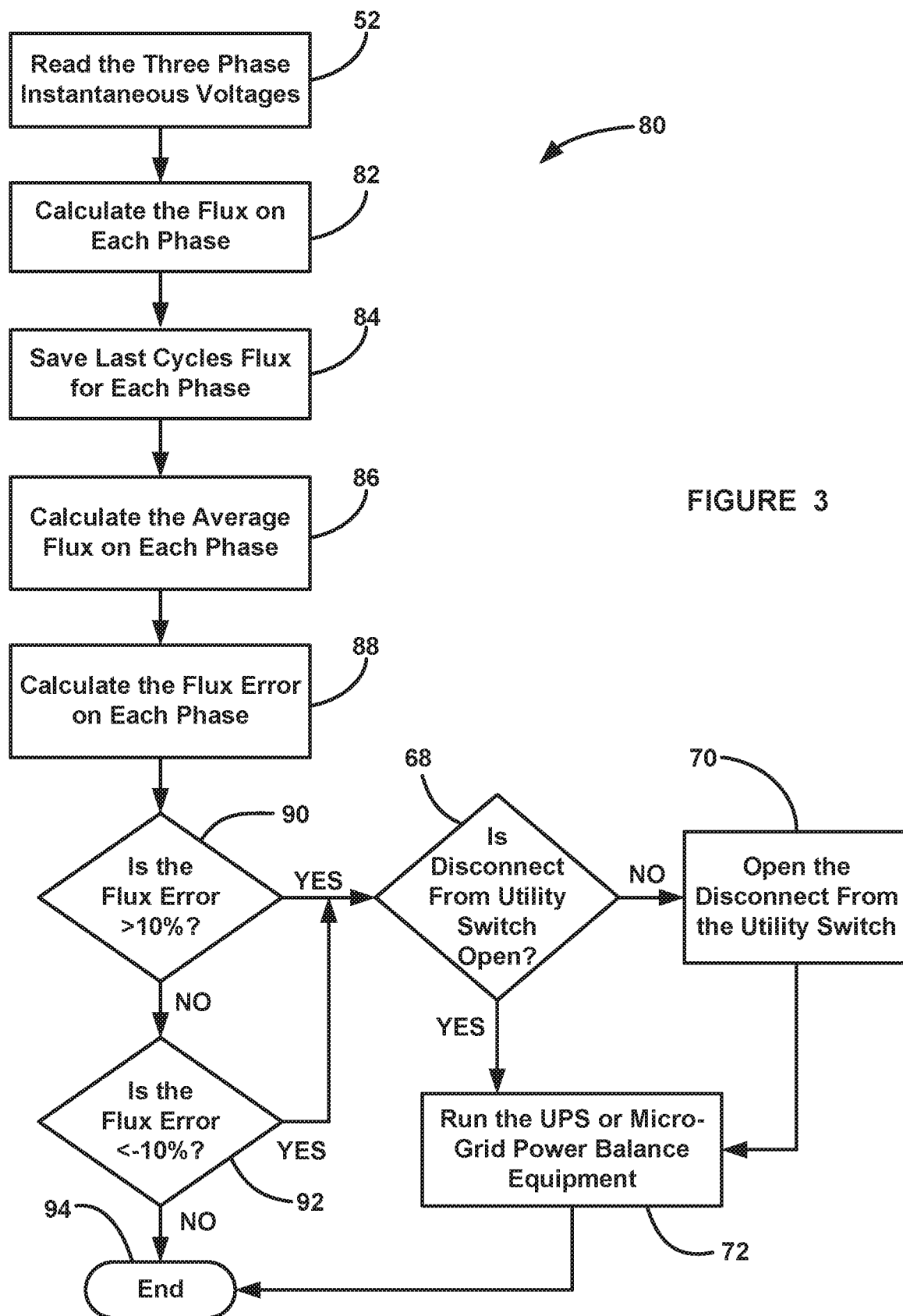
FIG. 3 is flow chart diagram showing a process for detecting a utility voltage disturbance by calculating magnetic flux of an isolation transformer.

FIG. 3 is a flow chart diagram 80 showing how this embodiment is performed by using transformer flux in the UPS system 10 to detect a voltage disturbance on the line 12 and open the switch 22, where like elements to flow chart diagram 50 are identified by the same reference number. As with the process of the flow chart diagram 50, each of the operations referred to in the diagram 80 is performed at a certain sampling rate to provide the desired switching speed and reduce the chance of false positives, such as 4800 times per second.

As above, the algorithm reads the three-phase instantaneous voltages $V_{a\_inst}$, $V_{b\_inst}$ and $V_{c\_inst}$ at the box 52. Next, the algorithm calculates the transformer flux for each phase at the current sample point as flux values $V_{a\_flux}$, $V_{b\_flux}$ and $V_{c\_flux}$ at box 82, where adding the measured voltages at two consecutive time periods operates as summing volt-seconds to obtain the flux value, as:

$$V_{a\_flux} = V_{a\_flux}(\text{previous}) + V_{a\_inst} - K_{p\_flux} * V_{a\_flux\_ave}, \quad (1)$$

$$V_{b\_flux} = V_{b\_flux}(\text{previous}) + V_{b\_inst} - K_{p\_flux} * V_{b\_flux\_ave}, \quad (2)$$

$$V_{c\_flux} = V_{c\_flux}(\text{previous}) + V_{c\_inst} - K_{p\_flux} * V_{c\_flux\_ave}, \quad (3)$$

where $V_{a\_flux}$(previous), $V_{b\_flux}$(previous) and $V_{c\_flux}$(previous) are the measured voltages at the previous sample time, $K_{p\_flux}$ is a proportional term defined by asymmetrical losses in the transformer core due to asymmetrical voltages on the core, and $V_{flux\_ave}$ is an average of the calculated flux over a sample period, i.e., one AC cycle, where $K_{p\_flux} * V_{flux\_ave}$ is a correction for a DC flux offset due to starting and measurement errors, and where if there is no offset, $V_{flux\_ave}$ will be zero.

At box 84, the algorithm updates the saved flux values for the last AC cycle of flux values $V_{a\_flux}$, $V_{b\_flux}$ and $V_{c\_flux}$ so that the previous sample flux values are available for equations (1)-(3) for the next sample calculation, and all of the last eighty flux values $V_{a\_flux}$, $V_{b\_flux}$ and $V_{c\_flux}$ are available to calculate a new average flux in equations (4)-(6) below and the flux values $V_{a\_flux}$, $V_{b\_flux}$ and $V_{c\_flux}$ from one cycle ago are available to calculate a flux error value $V_{flux\_err}$ in equations (7)-(9) below. The algorithm then calculates the average flux value $V_{flux\_ave}$ for each phase at box 86, for example, by adding all of the saved flux values and dividing that value by eighty, which are used in equations (1)-(3) for the next sample calculations, as:

$$V_{a\_flux\_ave} = \text{OneCycleSlidingWindowFilter}(V_{a\_flux}), \quad (4)$$

$$V_{b\_flux\_ave} = \text{OneCycleSlidingWindowFilter}(V_{b\_flux}), \quad (5)$$

$$V_{c\_flux\_ave} = \text{OneCycleSlidingWindowFilter}(V_{c\_flux}). \quad (6)$$

The algorithm then calculates the flux error value $V_{flux\_err}$ for each phase at the sample rate at box 88 as:

$$V_{a\_flux\_err} = V_{a\_flux}(\text{now}) - V_{a\_flux}(1 \text{ cycle ago}), \quad (7)$$

$$V_{b\_flux\_err} = V_{b\_flux}(\text{now}) - V_{b\_flux}(1 \text{ cycle ago}), \quad (8)$$

$$V_{c\_flux\_err} = V_{c\_flux}(\text{now}) - V_{c\_flux}(1 \text{ cycle ago}), \quad (9)$$

where $V_{flux}$(1 cycle ago) is the flux value calculated 80 sample points earlier.

The algorithm then determines whether any of the flux error values $V_{a\_flux\_err}$, $V_{b\_flux\_err}$ and $V_{c\_flux\_err}$ is greater than a predetermined percentage, for example, 10%, at decision diamond 90. If the flux error value is not greater than the predetermined percentage at the decision diamond 90, then the algorithm determines whether any of the flux error values $V_{a\_flux\_err}$, $V_{b\_flux\_err}$ and $V_{c\_flux\_err}$ is less than −10%, and if not the algorithm ends at block 94. If either of the conditions is occurring at the decision diamonds 90 and 92, then the static switch 22 is opened at the decision diamond 68.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for detecting a voltage disturbance on an electrical line coupled to a utility, where the utility provides three-phase electrical AC power signals on the line to an electrical system, said method comprising:

reading instantaneous voltage measurements of each of the three-phase power signals on the electrical line at a predetermined sample rate;

calculating a sliding window actual root mean squared (RMS) voltage of each three-phase power signal at the sample rate over a first predetermined sample period using the instantaneous voltage measurements;

calculating a sliding window filtered RMS average voltage of each three-phase power signal at the sample rate over a second predetermined sample period to identify voltage changes of the three-phase power signals from a nominal voltage;

determining whether any of the actual RMS voltages is greater than a first predetermined percentage of the nominal voltage at the sample rate;

determining whether any of the actual RMS voltages is less than a second predetermined percentage of the nominal voltage at the sample rate;

obtaining a difference between the actual RMS voltage and the RMS average voltage for each of the three-phase power signals at the sample rate;

determining whether the difference between the actual RMS voltage and the RMS average voltage for any of the three-phase power signals is greater than a third predetermined percentage at the sample rate;

determining whether the difference between the actual RMS voltage and the RMS average voltage for any of the three-phase signals is less than a fourth predetermined percentage at the sample rate; and detecting the voltage disturbance if any of the actual RMS voltages is greater than the first predetermined percentage or any of the actual RMS voltages is less than the second predetermined percentage or the difference between the actual RMS voltage and the RMS average voltage for any of the three-phase power signals is greater than the third predetermined percentage or the difference between the actual RMS voltage and the RMS average voltage of any of the three-phase power signals is less than the fourth predetermined percentage.

2. The method according to claim 1 wherein the predetermined sample rate is 4800 samples per second.

3. The method according to claim 1 wherein the first predetermined sample period is a one-half AC cycle of the three-phase power signals.

4. The method according to claim 1 wherein the second predetermined sample period is a full AC cycle of the three-phase power signals.

5. The method according to claim 1 wherein the first predetermined percentage is 110% of the nominal voltage, the second predetermined percentage is 90% of the nominal voltage, the third predetermined percentage is 10% and the fourth predetermined percentage is −10%.

6. The method according to claim 1 wherein calculating a sliding window filtered RMS average voltage includes calculating the RMS average voltages as a percentage of an actual voltage of the three-phase power signals so that the calculated RMS average voltages will be equal to the actual voltage after a predetermined time constant.

7. The method according to claim 6 wherein the predetermined time constant is about five minutes.

8. The method according to claim 1 wherein the electrical system is a critical load or a micro-grid.

9. The method according to claim 1 further comprising disconnecting the electrical system from the utility if the voltage disturbance is detected.

10. A method for detecting a voltage disturbance on an electrical line coupled to a utility, where the utility provides an AC power signal on the line to an electrical system, said method comprising:
   reading an instantaneous voltage measurement of the power signal on the electrical line at a predetermined sample rate;
   calculating a sliding window actual root mean squared (RMS) voltage of the power signal at the sample rate over a first predetermined sample period using the instantaneous voltage measurements;
   calculating a sliding window filtered RMS average voltage of the power signal at the sample rate over a second predetermined sample period to identify voltage changes of the power signal from a nominal voltage;
   obtaining a difference between the actual RMS voltage and the RMS average voltage for the power signal at the sample rate;
   determining whether the difference between the actual RMS voltage and the RMS average voltage for the power signal is greater than a first predetermined percentage at the sample rate;
   determining whether the difference between the actual RMS voltage and the RMS average voltage for the power signal is less than a second predetermined percentage at the sample rate; and
   detecting the voltage disturbance if either the difference between the actual RMS voltage and the RMS average voltage for the power signal is greater than the first predetermined percentage or the difference between the actual RMS voltage and the RMS average voltage of the power signal is less than the second predetermined percentage.

11. The method according to claim 10 wherein the predetermined sample rate is 4800 samples per second.

12. The method according to claim 10 wherein the first predetermined sample period is a one-half AC cycle of the power signal.

13. The method according to claim 10 wherein the second predetermined sample period is a full AC cycle of the power signal.

14. The method according to claim 10 wherein the first predetermined percentage is 10% and the second predetermined percentage is −10%.

15. The method according to claim 10 wherein calculating a sliding window filtered RMS average voltage includes calculating the RMS average voltages as a percentage of an actual voltage of the power signal so that the calculated RMS average voltages will be equal to the actual voltage after a predetermined time constant.

16. The method according to claim 15 wherein the predetermined time constant is about five minutes.

17. The method according to claim 10 wherein the electrical system is a critical load or a micro-grid.

18. The method according to claim 10 further comprising disconnecting the electrical system from the utility if the voltage disturbance is detected.

19. The method according to claim 10 wherein the power signal is a three-phase power signal.

20. A method for detecting a voltage disturbance on an electrical line coupled to a utility, where the utility provides three-phase electrical AC power signals on the line to an electrical system, said method comprising:
   reading instantaneous voltage measurements of each of the three-phase power signals on the electrical line at a predetermined sample rate of 4800 samples per second;
   calculating a sliding window actual root mean squared (RMS) voltage of each three-phase power signal at the sample rate over a first predetermined sample period of a one-half AC cycle of the power signal using the instantaneous voltage measurements;
   calculating a sliding window filtered RMS average voltage of each three-phase power signal at the sample rate over a second predetermined sample period of a full AC cycle of the power signal to identify voltage changes of the three-phase power signals from a nominal voltage;
   determining whether any of the actual RMS voltages is greater than a first predetermined percentage of 110% of the nominal voltage at the sample rate;
   determining whether any of the actual RMS voltages is less than a second predetermined percentage of 90% of the nominal voltage at the sample rate;
   obtaining a difference between the actual RMS voltage and the RMS average voltage for each of the three-phase power signals at the sample rate;
   determining whether the difference between the actual RMS voltage and the RMS average voltage for any of the three-phase signals is greater than a third predetermined percentage of 10% at the sample rate;
   determining whether the difference between the actual RMS voltage and the RMS average voltage for any of the three-phase power signals is less than a fourth predetermined percentage of −10% at the sample rate;
   detecting the voltage disturbance if any of the actual RMS voltages is greater than the first predetermined percentage or any of the actual RMS voltages is less than the second predetermined percentage or the difference between the actual RMS voltage and the RMS average voltage for any of the three-phase power signals is greater than the third predetermined percentage or the difference between the actual RMS voltage and the RMS average voltage of any of the three-phase power signals is less than the fourth predetermined percentage; and disconnecting the electrical system from the utility if the voltage disturbance is detected.

\* \* \* \* \*